United States Patent
He (10) Patent No.: US 11,556,037 B2
(45) Date of Patent: Jan. 17, 2023

(54) ARRAY SUBSTRATE, DISPLAY PANEL, AND DISPLAY APPARATUS

(71) Applicant: HKC Corporation Limited, Shenzhen (CN)

(72) Inventor: Huailiang He, Shenzhen (CN)

(73) Assignee: HKC CORPORATION LIMITED, Shenzhen (CN)

( * ) Notice: Subject to any disclaimer, the term of this patent is extended or adjusted under 35 U.S.C. 154(b) by 130 days.

(21) Appl. No.: 17/043,564

(22) PCT Filed: Nov. 12, 2018

(86) PCT No.: PCT/CN2018/114944
§ 371 (c)(1),
(2) Date: Sep. 29, 2020

(87) PCT Pub. No.: WO2020/093407
PCT Pub. Date: May 14, 2020

(65) Prior Publication Data
US 2021/0026177 A1    Jan. 28, 2021

(30) Foreign Application Priority Data

Nov. 5, 2018    (CN) .......................... 201811307911.3

(51) Int. Cl.
*G02F 1/1368* (2006.01)
*G02F 1/1362* (2006.01)
*H01L 27/12* (2006.01)

(52) U.S. Cl.
CPC ...... *G02F 1/1368* (2013.01); *G02F 1/136286* (2013.01); *H01L 27/124* (2013.01)

(58) Field of Classification Search
CPC ..................................................... G02F 1/1368
See application file for complete search history.

(56) References Cited

U.S. PATENT DOCUMENTS

| | | | |
|---|---|---|---|
| 2008/0143900 A1 | 6/2008 | Tsao et al. | |
| 2009/0009673 A1 | 1/2009 | Hisada | |
| 2013/0075728 A1* | 3/2013 | Liu | H01L 27/1251 |
| | | | 257/E29.273 |
| 2013/0208206 A1* | 8/2013 | Park | H01L 29/41733 |
| | | | 257/E33.053 |
| 2018/0081470 A1* | 3/2018 | Li | G06F 3/0443 |
| 2019/0204696 A1* | 7/2019 | Kim | G02F 1/1368 |

FOREIGN PATENT DOCUMENTS

| | | | | |
|---|---|---|---|---|
| CN | 1581513 | * | 2/2005 | ............ G02F 1/136 |
| CN | 201867560 U | | 6/2011 | |

OTHER PUBLICATIONS

International Search Report dated Jun. 5, 2019, issued in corresponding International Application No. PCT/CN2018/114944, 2 pages.
Office Action dated Apr. 2, 2019, in corresponding Chinese application No. 201811307911.3, 5 pages.

* cited by examiner

*Primary Examiner* — Sang V Nguyen
(74) *Attorney, Agent, or Firm* — Hauptman Ham, LLP (57) ABSTRACT

In an array substrate, a first area of overlap between projections of a first source and a first gate of an active matrix switch of a first type on a base substrate is greater than a second area of overlap between projections of a second source and a second gate of an active matrix switch a second type on the base substrate.

15 Claims, 5 Drawing Sheets

ARRAY SUBSTRATE, DISPLAY PANEL, AND DISPLAY APPARATUS

CROSS REFERENCE TO RELATED APPLICATIONS

This application claims priority of Chinese patent application No. 201811307911.3, entitled "ARRAY SUBSTRATE, DISPLAY PANEL AND DISPLAY DEVICE" filed on Nov. 5, 2018, and the content of which is incorporated herein by reference in its entirety.

TECHNICAL FIELD

The application relates to an array substrate, a display panel and a display device.

BACKGROUND

Design of high-order panel product has been developed towards high-value, high-resolution products in recent years. In a market of Vertical Alignment (VA) series panel, pixel design of different domains is often used to improve the phenomenon of visual deviation at large viewing angles.

In an exemplary technique, generally, a pixel unit is divided into a main region and a secondary region. A pixel unit includes a plurality of sub-pixels. Then, an independent main region pixel electrode is provided in the main region, and an independent secondary region pixel electrode is provided in the secondary region. The main region pixel electrode and the secondary region pixel electrode are arranged alternately, so as to realize multi-domain display.

However, the inventor found that the display of different domains needs to be performed by charging the liquid crystal capacitance with different thin film transistor (TFT) elements. In consideration of a display quality at large viewing angle, when a fixed grayscale voltage is provided to charge a liquid crystal capacitance, different domains of the sub-pixel have grayscale difference due to a charging difference. In addition, parasitic capacitance differences due to different designs of a thin film transistor (TFT) device, such as the differences in gate-drain capacitance Cgd and gate-source capacitance Cgs, results in a difference in the optimum common voltage Vcom between the main region and the secondary region of the sub-pixel, thereby causing image sticking.

SUMMARY

According to various embodiments of the present disclosure, an array substrate, a display panel and display device is provided. A problem of image sticking in the exemplary technique is solved by reducing the difference in parasitic capacitance between a main region and a secondary region.

An array substrate is provided, including a first-typed active array switch disposed in a main region and a second-typed active array switch disposed in a secondary region. The first-typed active array switch includes: a first gate disposed on a base substrate and a first source disposed above the first gate. An area of an overlapping portion of a projection of the first source on the base substrate and a projection of the first gate on the base substrate is a first overlapping area. The second-typed active array switch includes: a second gate disposed on the base substrate and a second source disposed upper the second gate. An area of an overlapping portion of a projection of the second source on the base substrate and a projection of the second gate on the base substrate is a second overlapping area. The first overlapping area is larger than the second overlapping area.

In one of the embodiments, the array substrate further includes a data line, a plurality of main region pixel electrodes and a plurality of secondary region pixel electrodes. The first-typed active array switch further includes a first drain, and the second-typed active array switch further includes a second drain. The first drain is connected to the data line, and the first source is connected to a corresponding main region pixel electrode. The second drain is connected to the data line, and the second source is connected to a corresponding secondary region pixel electrode.

In one of the embodiments, the projection of the first source on the base substrate and the projection of the second source on the base substrate are both strip-shaped. The length of the projection of the first source on the base substrate is L1, and the length of the projection of the second source on the base substrate is L2, and L1>L2.

In one of the embodiments, the first source includes a first sub-source and a second sub-source. A projection of the first sub-source on the base substrate is a strip-shaped trace disposed along a first direction, and a projection of the second sub-source on the base substrate is a strip-shaped trace disposed along a second direction. The first sub-source and the second sub-source are connected.

In one of the embodiments, the second source includes a third sub-source and a fourth sub-source. A projection of the third sub-source on the base substrate is a strip-shaped trace disposed along a first direction, and a projection of the fourth sub-source on the base substrate is a strip-shaped trace disposed along a second direction. The third sub-source and the fourth sub-source are connected.

In one of the embodiments, an area of an overlapping portion of a projection of the first drain on the base substrate and the projection of the first gate on the base substrate is a third overlapping area, and an area of an overlapping portion of a projection of the second drain on the base substrate and the projection of the second gate on the base substrate is a fourth overlapping area. The third overlapping area is smaller than the fourth overlapping area.

In one of the embodiments, an overlapping area of the projection of the first drain on the base substrate and the projection of the first source on the base substrate is zero.

In one of the embodiments, an overlapping area of the projection of the second drain on the base substrate and the projection of the second source on the base substrate is zero.

A display panel is provided, including a color film substrate and an array substrate. The array substrate includes a first-typed active array switch disposed in a main region and a second-typed active array switch disposed in a secondary region. The first-typed active array switch includes: a first gate disposed on a base substrate and a first source disposed above the first gate. An area of an overlapping portion of a projection of the first source on the base substrate and a projection of the first gate on the base substrate is a first overlapping area. The second-typed active array switch includes: a second gate disposed on the base substrate and a second source disposed above the second gate. An area of an overlapping portion of a projection of the second source on the base substrate and a projection of the second gate on the base substrate is a second overlapping area. The first overlapping area is larger than the second overlapping area.

In one of the embodiments, the display panel further includes a data line, a plurality of main region pixel electrodes and a plurality of secondary region pixel electrodes. The first-typed active array switch further includes a first drain, and the second-typed active array switch further includes a second drain. The first drain is connected to the data line, and the first source is connected to a corresponding main region pixel electrode. The second drain is connected to the data line, and the second source is connected to a corresponding secondary region pixel electrode.

In one of the embodiments, the projection of the first source on the base substrate and the projection of the second source on the base substrate are both strip-shaped. The length of the projection of the first source on the base substrate is L1, and the length of the projection of the second source on the base substrate is L2, and L1>L2.

In one of the embodiments, the first source includes a first sub-source and a second sub-source. A projection of the first sub-source on the base substrate is a strip-shaped trace disposed along a first direction, and a projection of the second sub-source on the base substrate is a strip-shaped trace disposed along a second direction. The first sub-source and the second sub-source are connected.

In one of the embodiments, the second source includes a third sub-source and a fourth sub-source. A projection of the third sub-source on the base substrate is a strip-shaped trace disposed along a first direction, and a projection of the fourth sub-source on the base substrate is a strip-shaped trace disposed along a second direction. The third sub-source and the fourth sub-source are connected.

In one of the embodiments, an area of an overlapping portion of a projection of the first drain on the base substrate and the projection of the first gate on the base substrate is a third overlapping area, and an area of an overlapping portion of a projection of the second drain on the base substrate and the projection of the second gate on the base substrate is a fourth overlapping area. The third overlapping area is smaller than the fourth overlapping area.

In one of the embodiments, an overlapping area of the projection of the first drain on the base substrate and the projection of the first source on the base substrate is zero.

In one of the embodiments, an overlapping area of the projection of the second drain on the base substrate and the projection of the second source on the base substrate is zero.

A display device is provided, including a backlight module and a display panel. The display panel includes a color film substrate and an array substrate. The array substrate includes a first-typed active array switch disposed in a main region and a second-typed active array switch disposed in a secondary region. The first-typed active array switch includes: a first gate disposed on a base substrate and a first source disposed above the first gate. An area of an overlapping portion of a projection of the first source on the base substrate and a projection of the first gate on the base substrate is a first overlapping area. The second-typed active array switch includes: a second gate disposed on the base substrate and a second source disposed above the second gate. An area of an overlapping portion of a projection of the second source on the base substrate and a projection of the second gate on the base substrate being a second overlapping area. The first overlapping area is larger than the second overlapping area.

In one of the embodiments, the display device further data line, a plurality of main region pixel electrodes and a plurality of secondary region pixel electrodes. The first-typed active array switch further includes a first drain, and the second-typed active array switch further includes a second drain. The first drain is connected to the data line, and the first source is connected to a corresponding main region pixel electrode. The second drain is connected to the data line, and the second source is connected to a corresponding secondary region pixel electrode.

In one of the embodiments, the projection of the first source on the base substrate and the projection of the second source on the base substrate are both strip-shaped. The length of the projection of the first source on the base substrate is L1, and the length of the projection of the second source on the base substrate is L2, and L1>L2.

In one of the embodiments, the first source includes a first sub-source and a second sub-source. A projection of the first sub-source on the base substrate is a strip-shaped trace disposed along a first direction, and a projection of the second sub-source on the base substrate is a strip-shaped trace disposed along a second direction. The first sub-source and the second sub-source are connected.

The details of one or more embodiments of the invention are set forth in the accompanying drawings and the description below. Other features, objects, and advantages of the invention will be apparent from the description and drawings, and from the claims.

BRIEF DESCRIPTION OF THE DRAWINGS

To illustrate the technical solutions according to the embodiments of the present invention or in the prior art more clearly, the accompanying drawings for describing the embodiments or the prior art are introduced briefly in the following. Apparently, the accompanying drawings in the following description are only some embodiments of the present invention, and persons of ordinary skill in the art can derive other drawings from the accompanying drawings without creative efforts.

DETAILED DESCRIPTION OF THE EMBODIMENTS

In order to make the technical solutions and advantages of the present application more clear, the present application will be further described in detail below with reference to the accompanying drawings and embodiments. It is understood that the specific embodiments described herein are merely illustrative of the application and are not intended to be limiting.

Figure 1:
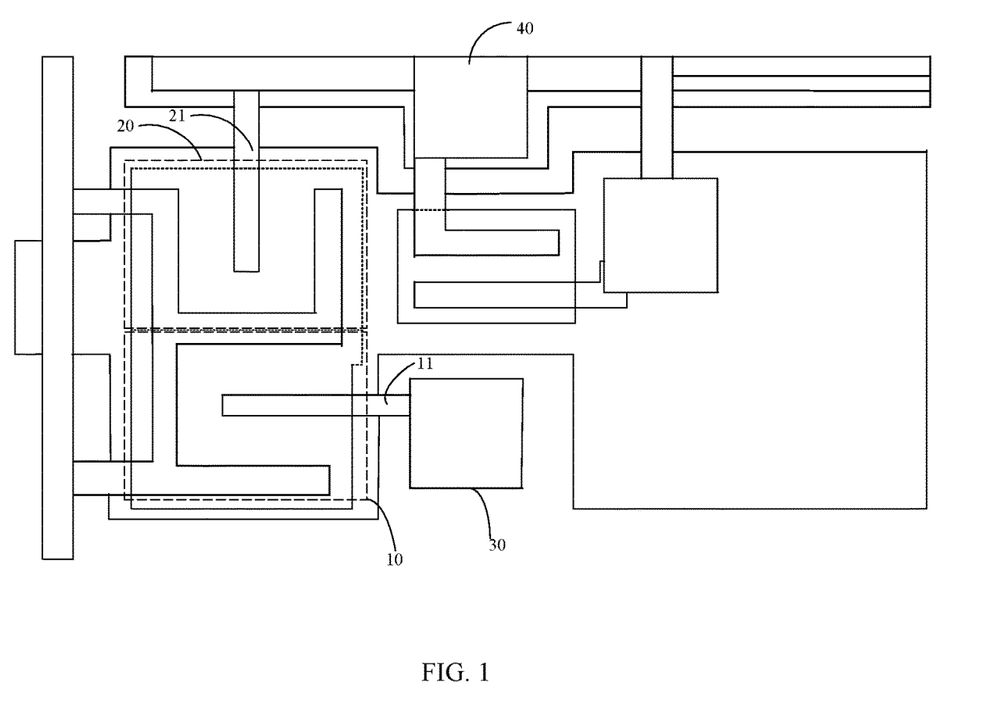
FIG. 1 is a schematic structural diagram of a pixel design of a thin film transistor of different domains according to an exemplary technique.

In a traditional pixel design of a thin film transistor (TFT) of different domains as shown in FIG. 1, in order to ensure that the viewing effects tend to be average from all directions, generally, one sub-pixel is divided into a plurality of regions, and the liquid crystals of each of the regions are inverted in different directions after being applied a voltage, that is a multi-domain design. The commonly used multi-domain implementation technique is to design the pixel electrode as an asterisk-shaped slit electrode structure, but such a pixel electrode structure may have a certain visual deviation. In order to overcome this defect, the engineer proposed a new framework to divide the pixel unit composed of one or more sub-pixels into a main region and a secondary region. A main region thin film transistor 10 is provided in the main region, and an independent secondary region thin film transistor 20 is provided in the secondary region. In operation, the main region thin film transistor 10 charges the main region pixel electrode 30, and the secondary region thin film transistor 20 charges the secondary region pixel electrode 40. In this way, different potentials are produced by the main region and the secondary region, so as to increase the viewing angle. However, in the traditional technology, the source 11 of the main region thin film transistor and the source 21 of the secondary region thin film transistor are mostly designed in a same structure, and thus in a case where the charge rate of the main region thin film transistor 10 and the secondary region thin film transistor 20 are optimal, the gate-source parasitic capacitance Cgs generated by the main region thin film transistor 10 is smaller than the gate-source parasitic capacitance Cgs generated by the secondary region thin film transistor 20, which makes the optimum common voltage required for the main region thin film transistor 10 and the secondary region thin film transistor 20 to be different. When the black and white image is displayed for a long time, the optimum common voltages of the main region thin film transistor 10 and secondary region thin film transistor 20 are both achieved, so that image sticking is easy to occur due to the imbalance between the positive and negative polarities.

Figure 2:
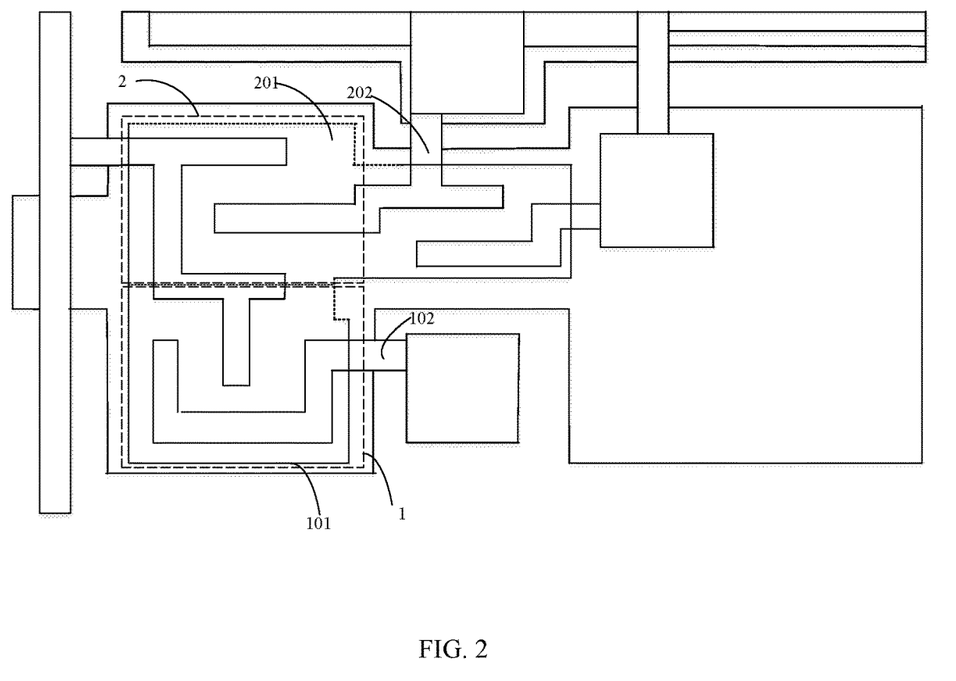
FIG. 2 is a schematic structural diagram of an array substrate according to an embodiment.

In order to solve the problem that image sticking is easy to occur in traditional technology, as shown in FIG. 2, according to an aspect of the embodiments of the present application, an array substrate is provided. The array substrate includes a first-typed active array switch 1 disposed in a main region and a second-typed active array switch 2 disposed in a secondary region. The first-typed active array switch 1 includes: a first gate 101 disposed on a base substrate and a first source 102 disposed above the first gate 101. An area of an overlapping portion of a projection of the first source 102 on the base substrate and a projection of the first gate 101 on the base substrate is a first overlapping area. The second-typed active array switch 2 includes: a second gate 201 disposed on the base substrate and a second source 202 disposed above the second gate 201. An area of an overlapping portion of a projection of the second source 202 on the base substrate and a projection of the second gate 201 on the base substrate is a second overlapping area. The first overlapping area is larger than the second overlapping area.

The base substrate is an epitaxial layer grown substrate, and plays a role of support and fixation during the production and fabrication process of the array substrate. The first-typed active array switch 1 refers to a thin film transistor provided in the main region and configured to drive the main region pixel electrode 4. The second-typed active array switch 2 refers to a thin film transistor provided in the secondary region and configured to drive the secondary region pixel electrode 5. The overlapping portion of the projection refers to the coincident portion of the two projections projected on a same plane. Being above the gate refers to that the source is disposed on a side away from the base substrate, and it is not excluded that a gate insulating layer, a semiconductor material layer, or the like are interposed between the gate and the source (drain).

The first gate 101 of the first-typed active array switch 1 is disposed on the base substrate and is disposed corresponding to the first source 102, so that there is a coincident portion between the projections of the first source 102 and the first gate 101 on the plane of the base substrate, and the area of the coincident portion is the first overlapping area. The second gate 201 of the second-typed active array switch 2 is disposed on the base substrate and is disposed corresponding to the second source 202. There is a coincident region between the projection of the second gate 201 and the second source 202 on the plane of the base substrate.

The area of the coincident region is the second overlapping area. The first overlapping area affects the gate-source parasitic capacitance of the first-typed active array switch 1. The size of the second overlapping area affects the gate-source parasitic capacitance of the second-typed active array switch 2. According to the characteristics of capacitance, the larger the overlapping area is, the larger corresponding parasitic capacitance generated accordingly will be. When the first overlapping area and the second overlapping area are the same, and the charging rates of the first-typed active array switch 1 and the second-typed active array switch 2 of are optimal, the gate-source parasitic capacitance generated by the first-typed active array switch 1 is smaller than the gate-source parasitic capacitance generated by the second-typed active array switch 2. In the embodiment of this application, the first overlapping area is larger than the second overlapping area, so as to reduce the difference between the gate-source parasitic capacitance of the first-typed active array switch 1 and the gate-source parasitic capacitance of the second-typed active array switch 2. In this way, image sticking due to the optimal common voltage differences in the main region and secondary region resulted from the differences in the values of the gate-source parasitic capacitance in different regions is avoided. In this way, the display effect of the display panel is improved, the occurrence of image sticking is reduced or avoided, and the degree of flicker is reduced. One sub-pixel may include a certain number of first-typed active array switches 1 and a certain number of second-typed active array switches 2.

Figure 3:
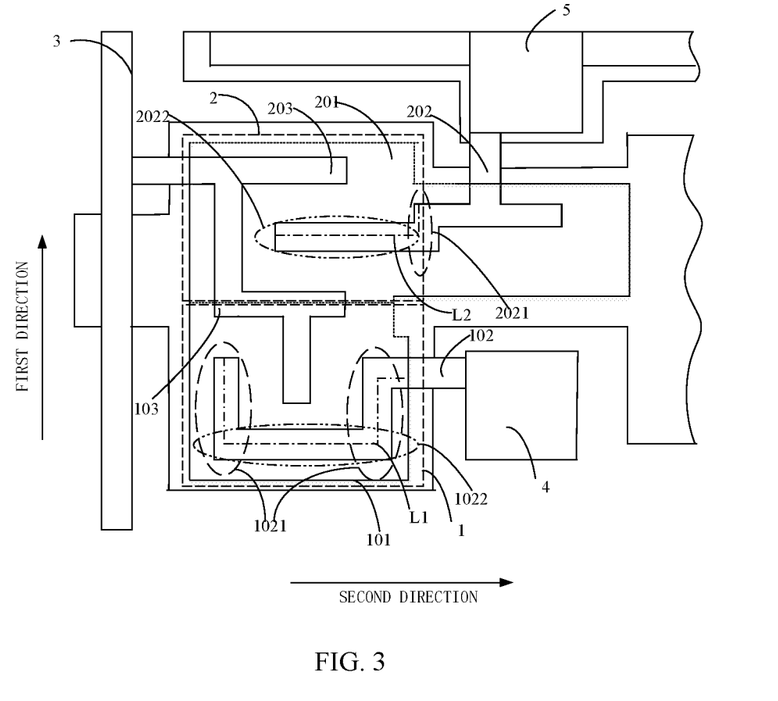
FIG. 3 is a schematic structural diagram of an array substrate according to another embodiment.

In one embodiment, as shown in FIG. 2 and FIG. 3, the array substrate further includes a data line 3, a plurality of main region pixel electrodes 4, and a plurality of secondary region pixel electrodes 5. The first-typed active array switch 1 further includes a first drain 103, and the second-typed active array switch 2 further includes a second drain 203. The first drain 103 is connected to the data line 3, and the first source 102 is connected to a corresponding main region pixel electrode 4; and the second drain 203 is connected to the data line 3, and the second source 202 is connected to a corresponding secondary region pixel electrode 5.

Figure 4:
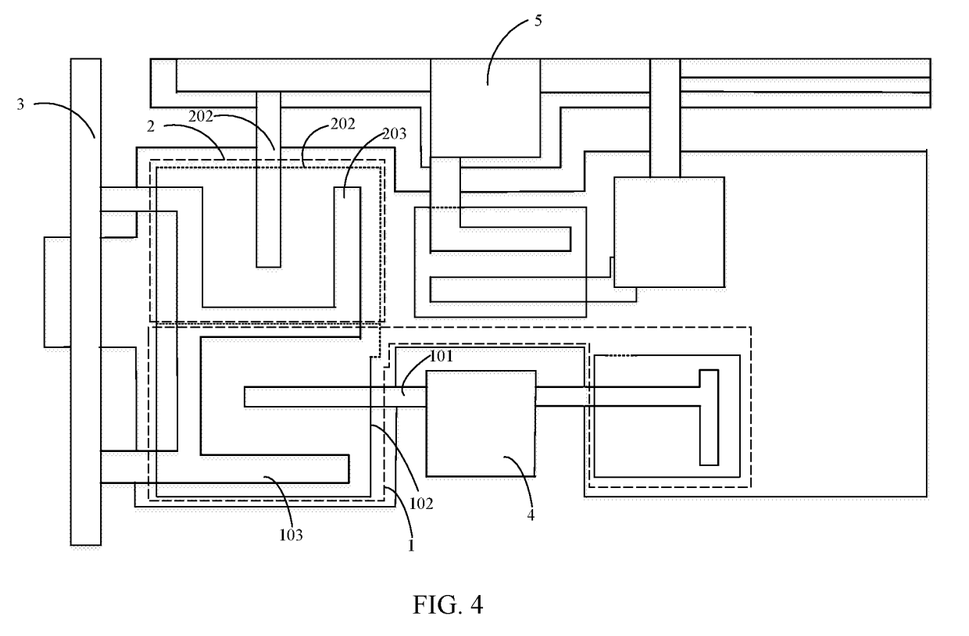
FIG. 4 is a schematic structural diagram of an array substrate according to a further embodiment.

The main region pixel electrode 4 refers to a pixel electrode disposed in the first-typed active array switch 1. The secondary region pixel electrode 5 refers to a pixel electrode disposed in the second-typed active array switch 2. The data line 3 is configured to transmit the received image data to the respective thin film transistors to control the brightness of the respective thin film transistors, so as to realize the display of the corresponding image. Both the first-typed active array switch 1 and the second-typed active array switch 2 use a connection mode of source driving liquid crystal. The first drain 103 and the second drain 203 are connected to the data line 3. The image data applies a certain voltage on the first drain 103 and the second drain 203 respectively through the data line 3 when the gate 101 and the second gate 201 are turned on, thus changing the voltages that the first source 102 and the second source 202 applied on the corresponding main region pixel electrode 4 and the secondary region pixel electrode 5. It should be noted that the direction in which the first source 102 is disposed is not limited. For example, the first source 102 may extend on a side of the main pixel electrode 4 close to the first drain 103, so that the first overlapping area is larger than the second overlapping area. As shown in FIG. 4, the first source 102 may also extend on a side of the main region pixel electrode 4 away from the first drain 103, so that the first overlapping area is larger than the second overlapping area. The first source 102 may also extend on both sides of the liquid crystal connected thereto, and so on.

In one embodiment, as shown in FIG. 2 and FIG. 3, the projection of the first source 102 on the base substrate and the projection of the second source 202 on the base substrate are both strip-shaped. The length of the projection of the first source 102 on the base substrate is L1, and the length of the projection of the second source 202 on the base substrate is L2, and L1>L2.

The projection of the first source 102 on the base substrate is strip-shaped, but it does not limit the specific shape of the first source 102 itself, and only limits that its projection is strip-shaped. Similarly, the projection of the second source 202 on the base substrate is strip-shaped, but it does not limit the specific shape of the second source 202 itself. The length L1 of the projection of the first source 102 on the base substrate is greater than the length L2 of the projection of the second source 202 on the substrate, which can improve the difference between the gate-source parasitic capacitance of the first-typed active array switch 1 and the gate-source parasitic capacitance of the second-typed active array switch 2, thereby avoiding image sticking.

In one of the embodiments, as shown in FIG. 3, the first source 102 includes a first sub-source 1021 and a second sub-source 1022. A projection of the first sub-source 1021 on the base substrate is a strip-shaped trace disposed along a first direction, and a projection of the second sub-source 1022 on the base substrate is a strip-shaped trace disposed along a second direction. The first sub-source 1021 and the second sub-source 1022 are connected.

The first source 102 is composed of a plurality of sub-sources. The first source 102 includes a plurality of first sub-sources 1021 and a plurality of the second sub-source 1022. The projections of the first sub-source 1021 and the second sub-source 1022 on the base substrate are along the first direction and the second direction respectively. That is, when the array substrate is placed on a plane, and the base substrate is in contact with the plane, the first source 102, which is consisted by connecting the first sub-source 1021 and the second sub-source 1022, has a fold line extending in different directions. For example, when the first direction is perpendicular to the second direction, the first source 102 may have a zigzag fold line when the array substrate is viewed from above. It should be noted that the first sub-source 1021 and the second sub-source 1022 are two types of traces that are distinguished according to the direction of projection, and the numbers of the first sub-source 1021 and the second sub-source 1022 are not limited.

In one embodiment, as shown in FIG. 3, the second source 202 includes a third sub-source 2021 and a fourth sub-source 2022. A projection of the third sub-source 2021 on the base substrate is a strip-shaped trace disposed along the first direction, and the projection of the fourth sub-source 2022 on the base substrate is a strip-shaped trace disposed along the second direction. Third sub-source 2021 and fourth sub-source 2022 are connected.

As mentioned in the above embodiment, the second source 202 may also be composed of a plurality of sub-sources. The projections of the third sub-source 2021 and the fourth sub-source 2022 on the base substrate are disposed along the first direction and the second direction respectively, forming the second source 202. When the array substrate is viewed from the above, the second source 202 may be a fold line formed by strip lines in the first direction and the second direction. Same as the above, when the first direction is perpendicular to the second direction, the projection of the second source 202 may be a zigzag fold line.

In one of the embodiments, as shown in FIG. 3, an area of an overlapping portion of a projection of the first drain 103 on the base substrate and the projection of the first gate 101 on the base substrate is a third overlapping area, and an area of an overlapping portion of a projection of the second drain 203 on the base substrate and the projection of the second gate 201 on the base substrate is a fourth overlapping area. The third overlapping area is less than the fourth overlapping area.

The overlapping portion of the projection of the first drain 103 and the first gate 101 on the base substrate is the third overlapping area, and the area of the overlapping portion of the projection of the second drain 203 and the second gate 201 on the base substrate is the fourth overlapping area. In order to ensure a high aperture rate and overcome the problem of decreased aperture rate caused by the increase of the area occupied by the projection of the first gate 101, comparing with the design in the traditional technology that a same mechanism is used in the drains of the main region and the secondary region, the solution provided by the embodiment of the present application reduces the third overlapping area of the first drain 103 corresponding to the first gate 101 on the base substrate, so that the third overlapping area is made to be smaller than the fourth overlapping area. In this way, the aperture rate is ensured, and thus the performance of the array substrate is further improved. Optionally, the first drain 103 is disposed above the first gate 101, and the second drain 203 is disposed above the second gate 201. It is also possible that the first drain 103, the first source 102, the second drain 203, and the second source 202 are disposed on the same wiring layer. The array substrate may be sequentially provided with the followings from bottom to top: the base substrate, the first gate electrode 101 and the second gate electrode 201 disposed on the base substrate, and gate insulating layer disposed on the first gate electrode 101 and the second gate electrode 201, the active layer disposed on the gate insulating layer, the first drain 103, the first source 102, the second drain 203, and the second source 202 disposed on the active layer, and a passivation layer covered on the drain and the source.

In one of the embodiments, as shown in FIG. 3, an overlapping area of the projection of the first drain 103 on the base substrate and the projection of the first source 102 on the base substrate is zero. Specifically, when disposing the first drain 103 and the first source 102, the projections of the two on the base substrate do not overlap, that is, there is no drain-source parasitic capacitance generated between the first drain 103 and the first source 102, and the display performance of the array substrate can be better improved. Optionally, placing the array substrate on a plane and making the base substrate in contact with the plane, when the array substrate is view from the above, the first drain 103 and the first source 102 are strip lines disposed spaced apart and there is no intersection among the strip lines.

In one of the embodiments, as shown in FIG. 3, an overlapping area of the projection of the second drain 203 on the base substrate and the projection of the second source 202 on the base substrate is zero. Same as the above, in order to avoid the second-typed active array switch 2 generating the drain-source parasitic capacitance, the projection of the second drain 203 on the base substrate and the projection of the second source 202 on the base substrate do not overlap.

Figure 5:
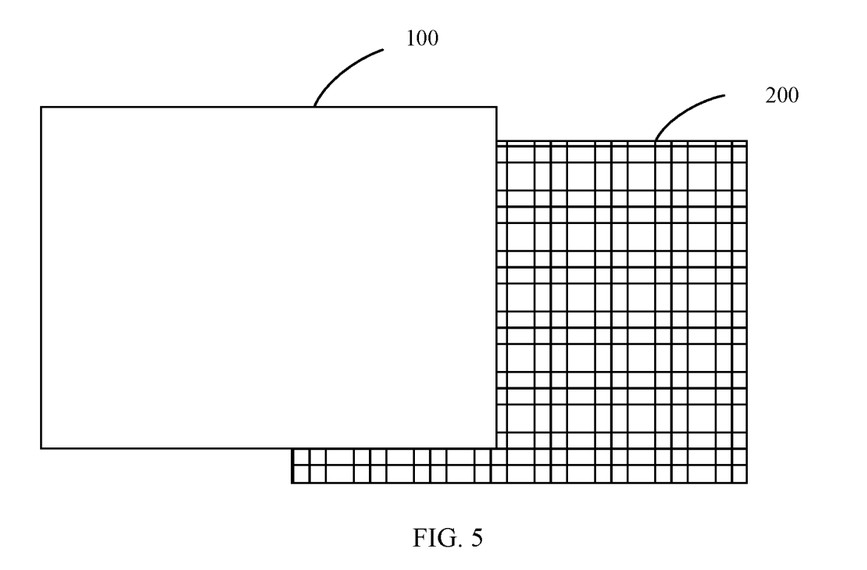
FIG. 5 is a schematic structural diagram of a display panel according to an embodiment.

A display panel, as shown in FIG. 5, includes a color film substrate 100 and the above array substrate 200. Specifically, the display panel provided by the embodiment of the present application consists of the above array substrate 200 and color film substrate 100. The color film substrate 100 is disposed corresponding to the array substrate 200. When the display panel is operating, array substrate 200 in the first-typed active array switch and the second-typed active array switch operates at a same optimal public voltage. In the charging and discharging process, the first-typed active array switch and the second-typed active array switch may discharge completely, and there is no charge residue, so as to avoid the occurrence of image sticking.

Figure 6:
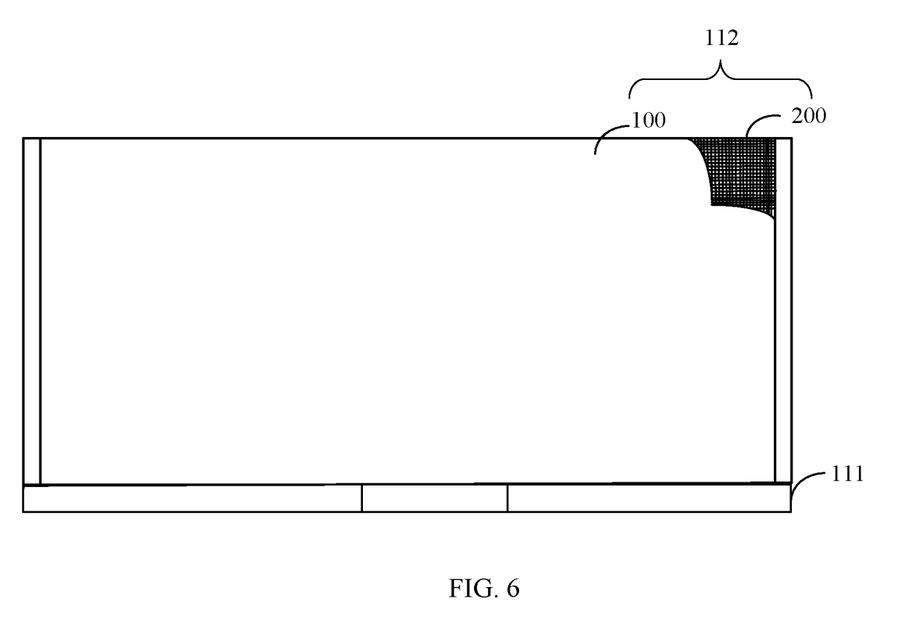
FIG. 6 is a schematic structural diagram of a display device according to an embodiment.

A display device, as shown in FIG. 6, includes a backlight module 111 and the above display panel 112. Specifically, according to the display device provided by the embodiment of the present application, when the backlight module 111 is operating, the backlight module 111 provides backlight light source, and the first-typed active array switch and the second-typed active array on the switch display panel 112 are turned on or turned off under the action of the driving circuit. The image data is transmitted to the each of the main region thin film transistors and secondary regional thin film transistors through the data line, the potential value of each main region pixel electrode and secondary region pixel electrode is changed, the deflection angle of the liquid crystal driven by each main region pixel electrode and the deflection angle of the liquid crystal driven by the secondary region pixel electrode are changed, and in combination with the color film substrate 100, the image is displayed. According to the display device provided by the embodiment of the present application, there is no image sticking during operation, and the performance is good.

Although the respective embodiments have been described one by one, it shall be appreciated that the respective embodiments will not be isolated. Those skilled in the art can apparently appreciate upon reading the disclosure of this application that the respective technical features involved in the respective embodiments can be combined arbitrarily between the respective embodiments as long as they have no collision with each other. Of course, the respective technical features mentioned in the same embodiment can also be combined arbitrarily as long as they have no collision with each other. Although the invention is illustrated and described herein with reference to specific embodiments, the invention is not intended to be limited to the details shown. Rather, various modifications may be made in the details within the scope and range of equivalents of the claims and without departing from the invention.

What is claimed is:

1. An array substrate, comprising:
a first-typed active array switch disposed in a main region; and
a second-typed active array switch disposed in a secondary region;
wherein
the first-typed active array switch includes: a first gate disposed on a base substrate and a first source disposed above the first gate, an area of an overlapping portion of a projection of the first source on the base substrate and a projection of the first gate on the base substrate being a first overlapping area,
the second-typed active array switch includes: a second gate disposed on the base substrate and a second source disposed above the second gate, an area of an overlapping portion of a projection of the second source on the base substrate and a projection of the second gate on the base substrate being a second overlapping area,
the first overlapping area is larger than the second overlapping area,
the array substrate further comprises
a data line,
a plurality of main region pixel electrodes, and
a plurality of secondary region pixel electrodes;
the first-typed active array switch further includes a first drain, and the second-typed active array switch further includes a second drain,
the first drain is connected to the data line, and the first source is connected to a corresponding main region pixel electrode,
the second drain is connected to the data line, and the second source is connected to a corresponding secondary region pixel electrode,
an area of an overlapping portion of a projection of the first drain on the base substrate and the projection of the first gate on the base substrate is a third overlapping area, and an area of an overlapping portion of a projection of the second drain on the base substrate and the projection of the second gate on the base substrate is a fourth overlapping area, and
the third overlapping area is smaller than the fourth overlapping area.

2. The array substrate of claim 1, wherein the projection of the first source on the base substrate and the projection of the second source on the base substrate are both strip-shaped; a length of the projection of the first source on the base substrate is L1, and a length of the projection of the second source on the base substrate is L2, and L1>L2.

3. The array substrate of claim 2, wherein the first source includes a first sub-source and a second sub-source; a projection of the first sub-source on the base substrate is a strip-shaped trace disposed along a first direction, and a projection of the second sub-source on the base substrate is a strip-shaped trace disposed along a second direction; the first sub-source and the second sub-source are connected.

4. The array substrate of claim 2, wherein the second source includes a third sub-source and a fourth sub-source; a projection of the third sub-source on the base substrate is a strip-shaped trace disposed along a first direction, and a projection of the fourth sub-source on the base substrate is a strip-shaped trace disposed along a second direction; the third sub-source and the fourth sub-source are connected.

5. The array substrate of claim 1, wherein an overlapping area of the projection of the first drain on the base substrate and the projection of the first source on the base substrate is zero.

6. The array substrate of claim 5, wherein an overlapping area of the projection of the second drain on the base substrate and the projection of the second source on the base substrate is zero.

7. A display panel, comprising:
a color filter substrate and an array substrate, the array substrate including a first-typed active array switch disposed in a main region and a second-typed active array switch disposed in a secondary region,
wherein
the first-typed active array switch includes: a first gate disposed on a base substrate and a first source disposed above the first gate, an area of an overlapping portion of a projection of the first source on the base substrate and a projection of the first gate on the base substrate being a first overlapping area, the second-typed active array switch includes: a second gate disposed on the base substrate and a second source disposed above the second gate, an area of an overlapping portion of a projection of the second source on the base substrate and a projection of the second gate on the base substrate being a second overlapping area, the first overlapping area is larger than the second overlapping area, the array substrate further includes
a data line,
a plurality of main region pixel electrodes, and
a plurality of secondary region pixel electrodes, the first-typed active array switch further includes a first drain, and the second-typed active array switch further includes a second drain, the first drain is connected to the data line, and the first source is connected to a corresponding main region pixel electrode, the second drain is connected to the data line, and the second source is connected to a corresponding secondary region pixel electrode, an area of an overlapping portion of a projection of the first drain on the base substrate and the projection of the first gate on the base substrate is a third overlapping area, and an area of an overlapping portion of a projection of the second drain on the base substrate and the projection of the second gate on the base substrate is a fourth overlapping area, and the third overlapping area is smaller than the fourth overlapping area.

8. The display panel of claim 7, wherein the projection of the first source on the base substrate and the projection of the second source on the base substrate are both strip-shaped; a length of the projection of the first source on the base substrate is L1, and a length of the projection of the second source on the base substrate is L2, and L1>L2.

9. The display panel of claim 8, wherein the first source includes a first sub-source and a second sub-source; a projection of the first sub-source on the base substrate is a strip-shaped trace disposed along a first direction, and a projection of the second sub-source on the base substrate is a strip-shaped trace disposed along a second direction; the first sub-source and the second sub-source are connected.

10. The display panel of claim 8, wherein the second source includes a third sub-source and a fourth sub-source; a projection of the third sub-source on the base substrate is a strip-shaped trace disposed along a first direction, and a projection of the fourth sub-source on the base substrate is a strip-shaped trace disposed along a second direction; the third sub-source and the fourth sub-source are connected.

11. The display panel according to claim 7, wherein an overlapping area of the projection of the first drain on the base substrate and the projection of the first source on the base substrate is zero.

12. The display panel according to claim 11, wherein an overlapping area of the projection of the second drain on the base substrate and the projection of the second source on the base substrate is zero.

13. A display device, comprising:
a backlight module and a display panel, the display panel including a color film substrate and an array substrate, the array substrate including a first-typed active array switch disposed in a main region and a second-typed active array switch disposed in a secondary region, wherein the first-typed active array switch includes: a first gate disposed on a base substrate and a first source disposed above the first gate, an area of an overlapping portion of a projection of the first source on the base substrate and a projection of the first gate on the base substrate being a first overlapping area, the second-typed active array switch includes: a second gate disposed on the base substrate and a second source disposed above the second gate, an area of an overlapping portion of a projection of the second source on the base substrate and a projection of the second gate on the base substrate being a second overlapping area, the first overlapping area is larger than the second overlapping area, the array substrate further includes
a data line,
a plurality of main region pixel electrodes, and
a plurality of secondary region pixel electrodes,
the first-typed active array switch further includes a first drain, and the second-typed active array switch further includes a second drain, the first drain is connected to the data line, and the first source is connected to a corresponding main region pixel electrode, the second drain is connected to the data line, and the second source is connected to a corresponding secondary region pixel electrode, an area of an overlapping portion of a projection of the first drain on the base substrate and the projection of the first gate on the base substrate is a third overlapping area, and an area of an overlapping portion of a projection of the second drain on the base substrate and the projection of the second gate on the base substrate is a fourth overlapping area, the third overlapping area is smaller than the fourth overlapping area.

14. The display device of claim 6, wherein the projection of the first source on the base substrate and the projection of the second source on the base substrate are both strip-shaped; a length of the projection of the first source on the base substrate is L1, and a length of the projection of the second source on the base substrate is L2, and L1>L2.

15. The display device of claim 14, wherein the first source includes a first sub-source and a second sub-source; a projection of the first sub-source on the base substrate is a strip-shaped trace disposed along a first direction, and a projection of the second sub-source on the base substrate is a strip-shaped trace disposed along a second direction; the first sub-source and the second sub-source are connected.

* * * * *